United States Patent
Kinoshita

(10) Patent No.: US 7,355,265 B2
(45) Date of Patent: Apr. 8, 2008

(54) SEMICONDUCTOR INTEGRATED CIRCUIT

(75) Inventor: Yasushi Kinoshita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/669,655

(22) Filed: Sep. 25, 2003

(65) Prior Publication Data
US 2004/0062011 A1   Apr. 1, 2004

(30) Foreign Application Priority Data
Sep. 26, 2002   (JP)   ............. 2002-281409

(51) Int. Cl.
H01L 29/00   (2006.01)
(52) U.S. Cl. ............... 257/532; 257/516; 257/536; 257/774; 257/293; 257/776; 257/E27.016; 257/E27.019; 361/734
(58) Field of Classification Search ........... 257/536, 257/532, 516, 774, 776, 295, 310, E27.016, 257/E27.019
See application file for complete search history.

(56) References Cited

U.S. PATENT DOCUMENTS 5,801,412 A * 9/1998 Tobita ............... 257/296
6,015,729 A * 1/2000 Shirley et al. ............ 438/239
6,285,050 B1 * 9/2001 Emma et al. ............. 257/296
2002/0094629 A1 * 7/2002 Belleville et al. .......... 438/218

FOREIGN PATENT DOCUMENTS

JP       08037281 A    *  7/1996
JP      2000-286385 A    10/2000
JP      2001-15601 A      1/2001

* cited by examiner

Primary Examiner—Lynne Gurley
Assistant Examiner—Samuel A Gebremariam
(74) Attorney, Agent, or Firm—Sughrue Mion, PLLC

(57) ABSTRACT

A semiconductor integrated circuit comprising a power supply wiring and a ground wiring and a decoupling capacitor formed between the power supply wiring and the ground wiring, wherein at least one electrode of the decoupling capacitor consists of a shield layer formed in a plane shape on a semiconductor substrate, and the shield layer is electrically connected directly to the semiconductor substrate and is fixed to a power supply potential or the ground potential.

19 Claims, 4 Drawing Sheets

SEMICONDUCTOR INTEGRATED CIRCUIT

BACKGROUND OF THE INVENTION

1. Field of the Invention

The present invention relates to a semiconductor integrated circuit, and more particularly to a semiconductor integrated circuit having a decoupling capacitor which reduces noise on a power supply wiring and a ground wiring formed on the semiconductor integrated circuit.

2. Description of the Prior Art

In order to reduce the effect of the noise on the power supply wiring in the semiconductor integrated circuit, there has been known a technique of coupling the power supply wiring and the ground wiring with a capacitor (decoupling capacitor). More specifically, a semiconductor integrated circuit is given a configuration in which along with the connection of a MOS capacitor formed on a semiconductor substrate, between the ground wiring and the power supply wiring, the ground wiring and the power supply wiring are disposed so as to be overlapped above and below with equal width with an interlayer insulating film in between, in order to further increase the degree of capacitive coupling between the ground wiring and the power supply wiring (see, Japanese Patent Applications Laid Open, No. 2001-15601 (prior art 1)).

Moreover, there has also been known a semiconductor integrated circuit in which shielding metal layers fixed to the ground potential level and a power supply voltage level, respectively, are formed between the semiconductor substrate and a signal wiring layer so as to cover almost the entire surface of the semiconductor substrate, to form a capacitor between the shielding metal layers by laminating the shielding metal layers via an insulating film (see, Japanese Patent Applications Laid Open, No. 2000-286385 (prior art 2)).

However, according to the invention described in the prior art 1, the power supply wiring and the ground wiring formed on the uppermost part of a multilayer wiring structure are connected to the substrate by contacts which penetrate the interlayer insulating films, so that the aspect ratio of the contact part becomes large and the inductance of the contact part is increased.

In particular, in the high frequency region, a residual inductance is elicited from the wiring together with the inductance of the contact part, and an LC serial resonance circuit is formed by these inductances and a coupling capacitor. As a result, there has been a problem in that the decoupling characteristics in the high frequency region is deteriorated due to reduction in the insertion loss caused by the occurrence of the resonance phenomenon in the high frequency region.

Moreover, since the thickness of the interlayer insulating film between the power supply wiring and the ground wiring is restrained by the process conditions of the multilayer wiring, there has been a problem in that the coupling capacitance cannot be increased and sufficient decoupling characteristics cannot be obtained.

Furthermore, when a multilayer wiring process is adopted in the invention described in the prior art 2, there are needed a large number of via holes for connecting signal wiring layers in the upper layers and the semiconductor substrate. However, the presence of the large number of via holes that penetrate shielding metal layers reduce the effect of the shielding metal layers for blocking the transmission of the noise from the semiconductor substrate to the signal wiring layers. Accordingly, there has been a problem in that application of the invention described in the prior art 2 to a multilayer wiring process is difficult.

BRIEF SUMMARY OF THE INVENTION

Summary of the Invention

It is the object of the present invention to provide a semiconductor integrated circuit comprising a power supply wiring, a ground wiring, and a decoupling capacitor formed between the power supply wiring and the ground wiring, wherein at least one of the electrodes of the decoupling capacitor is composed of a shield layer formed in a plane shape on the semiconductor substrate, the shield layer is electrically connected directly to the semiconductor substrate, and is fixed to a power supply potential or the ground potential.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
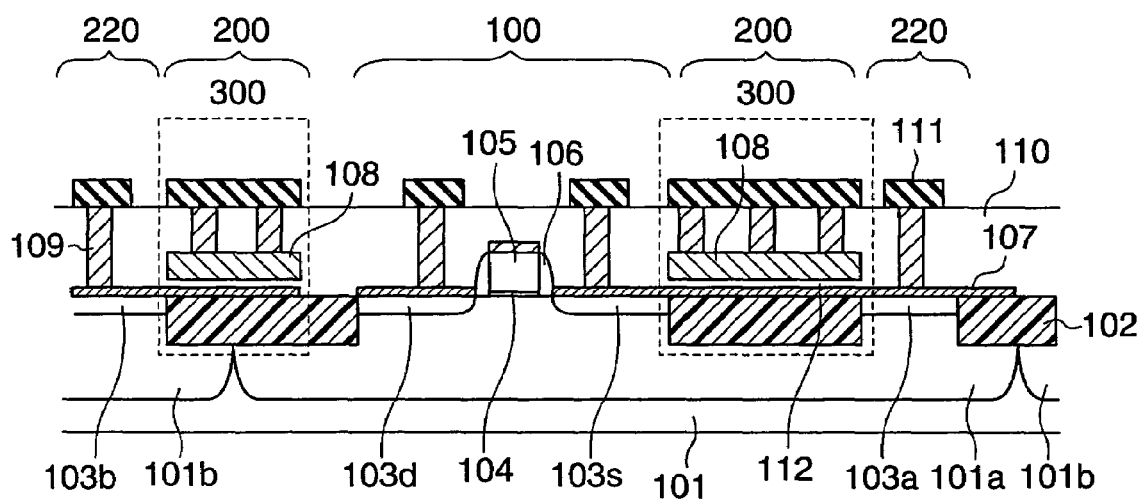
FIG. 1 is a sectional view showing the semiconductor integrated circuit according to embodiment 1 of the invention.

Referring to the drawings, the embodiments of the present invention will be described in detail.

A sectional view of the semiconductor integrated circuit according to the embodiment 1 of the invention is shown in FIG. 1.

A transistor region 100, power supply wiring regions 200 and ground wiring regions 220 are formed on a p- or n-conductivity type semiconductor substrate 101. The power supply wiring region 200 is formed above an element isolation region 102 formed of an oxide film obtained by the LOCOS method, the shallow trench method, or the like.

A semiconductor region with the p-conductivity type, namely, a p-well region 101a, and a semiconductor region with the n-conductivity type, namely, an n-well region 101b are formed within the semiconductor substrate 101. A transistor formed in the transistor region 100 in FIG. 1 is an n-type MOSFET.

The transistor region 100 comprises a gate electrode 105 composed of polycrystalline silicon, a sidewall insulating film 106 composed of an oxide film or a nitride film or their composite film, a gate insulating film 104 composed of a thermal oxide film or a high permittivity material, a diffusion layer 103d to be a drain region, and a diffusion layer 103s to be a source region.

The diffusion layer 103d which is to be the drain region and the diffusion layer 103s which is to be the source region, of the transistor generally have a conductivity type opposite to that of the well region, and they are n+ type regions in FIG. 1.

A silicide layer 107 formed of a silicon compound of metal such as titanium or cobalt is formed on the surface of the gate electrode 105, the diffusion layer 103d to be the drain region and the diffusion layer 103s to be the source region. The diffusion layer 103s which is to be the source region of the transistor region 100 and a well contact diffusion layer 103a of the ground wiring region 220 are electrically short-circuited by a plate-like silicide layer 107, and the diffusion layer 103s which is to be the source region is fixed to the ground potential. The well contact diffusion layer 103a is formed as a p-type diffusion layer in the p-well region 101a, and functions as a well contact.

The silicide layer 107 is used generally for the purpose of not only reducing the sheet resistance of the diffusion layer 103d which is to be the drain region and the diffusion layer 103s which is to be the source region, but also for simultaneously reducing the sheet resistance of the gate electrode 105 formed of pollycrystalline silicon. Although it is normal, after subjecting the diffusion layers to a silicidation reaction, to remove excess silicide layer remaining on the element isolation film by wet etching or the like, the silicide layer 107 on the contact diffusion layer 103a is not removed, and only the silicide layer in the unwanted regions other than the layer 107 is removed in this embodiment.

According to the embodiment of the invention, the silicide layer 107 is formed almost on the entire surface of the semiconductor substrate 101, and is connected to the semiconductor substrate 101 via the well contact diffusion layer 103a to be fixed to the ground potential. As a result, since the plate-like silicide layer 107 functions as a shield layer for shielding transmission of the noise from the semiconductor substrate 101 to the signal wiring layers, stabilization of circuit operation can be secured.

According to the embodiment of the invention, it is possible to form the shield layer without adding a new process to the formation process of the transistor.

On the silicide layer 107, a thin oxide film 112 is formed by CVD or the like, and a power supply wiring layer 108 is formed on top of it.

Since the power supply wiring layer 108 is formed on the element isolation region 102 and its wiring width can be expanded to the width of the element isolation region 102, its wiring resistance can be reduced. The power supply wiring layer 108 will be referred to as the wiring layer of a zeroth layer hereinafter.

An interlayer film 110 is formed on the power supply wiring layer 108 and the gate electrode 105, and the diffusion layers of the transistor and the power supply wiring layer 108 are connected to the upper layer wirings via contacts 109. Here, the upper layer wiring will be referred to as a wiring layer 111 of a first layer.

In the power supply wiring region 200, a decoupling capacitor region 300 for absorbing power supply noise, which is the feature part of the semiconductor integrated circuit of the embodiment 1, is formed.

The decoupling capacitor region 300 utilizes the interlayer capacitance formed of the oxide film 112.

The power supply wiring layer 108 which becomes the upper electrode of the decoupling capacitor region 300 is connected to the first layer wiring layer 111 which is a power supply wiring, and the silicide layer 107 which becomes its lower electrode is connected to the semiconductor substrate 101 via the well contact diffusion layer 103a.

The power supply wiring layer 108 is formed by using a metal, such as aluminum, copper, tungsten, and gold, or polysilicon as the raw material.

The interlayer film 110 is formed by using, for example, a nitride film or a plasma oxide film as the raw material.

As described in the above, according to the embodiment 1 of the invention, by laminating the silicide layer 107 fixed to the ground potential level and the power supply wiring layer 108 fixed to the power supply voltage level, there is formed a decoupling capacitor that has the oxide film 112 between the layers as the interlayer capacitance.

By means of the decoupling capacitor, the potential of the power supply wiring or the ground wiring of the digital circuit part is stabilized, and the noise generated in the digital circuit part can be suppressed.

In particular, since the oxide film 112 between the ground wiring layer and the power supply wiring layer used as the capacitor insulating film is formed by a process which is separate from the process of forming the interlayer film 110, it is possible to optimize the thickness as the capacitor insulating film. As a result, it is possible to obtain a semiconductor integrated circuit in which the effect of the noise on the power supply wiring is reduced effectively by increasing the degree of capacitive coupling between the ground wiring layer and the power supply wiring layer.

Moreover, according to the embodiment 1 of the invention, in the power supply wiring region 200, the power supply wiring is connected to the wiring layer 111 of the first layer by the contacts via the power supply wiring layer 108 having a large width. As a result, even if the aspect ratio of the contact connected to the transistor region 100 is made large, the aspect ratio of the contact in the power supply wiring region 200 can be kept small by increasing its width, and prevent the increase in the parasitic inductance.

Furthermore, the lower electrode of the decoupling capacitor, namely, the silicide layer 107, is formed almost on the entire surface of the semiconductor substrate, and is fixed to the substrate potential without intermediary of the contact. Therefore, even when the multilayer wiring structure is adopted, there will occur no increase in the parasitic inductance of the ground wiring region.

As described in the above, according to the embodiment 1 of the invention, the inductance attendant on the decoupling capacitor is reduced, and the resonance frequency of the LC serial resonance circuit formed by the decoupling capacitor and the inductance is shifted toward the high frequency side. Accordingly, since the frequency region free from resonance is extended to the high frequency side, the noise can be suppressed sufficiently even when the frequency of the noise on the power supply wiring connected to the power supply wiring layer 108 is increased.

Although in the embodiment 1 of the invention the decoupling capacitor region 300 is formed above the element isolation region 102, it can be formed in a region other than the element isolation region 102. However, by forming it above the element isolation region 102 as shown in the embodiment 1 of the invention, it is possible to form a decoupling capacitor with large coupling capacitance without causing an increase in the chip area.

Moreover, in the embodiment 1 of the invention, the silicide layer 107 connected to the semiconductor substrate 101 is made a ground wiring by fixing the semiconductor substrate 101 to the ground potential, and the upper electrode of the decoupling capacitor is made a power supply wiring by fixing it to the power supply potential via the contacts. However, potential fixing method is not limited to this mode, and the invention can also be applied to the case in which the silicide layer 107 connected to the semiconductor substrate 101 is made a power supply wiring by fixing the semiconductor substrate 101 to the power supply potential, and the upper electrode of the decoupling capacitor is made a ground wiring by fixing it to the ground potential via the contacts.

FIG. 2 is a plane layout drawing for describing the embodiment 1 of the invention.

Figure 2A:
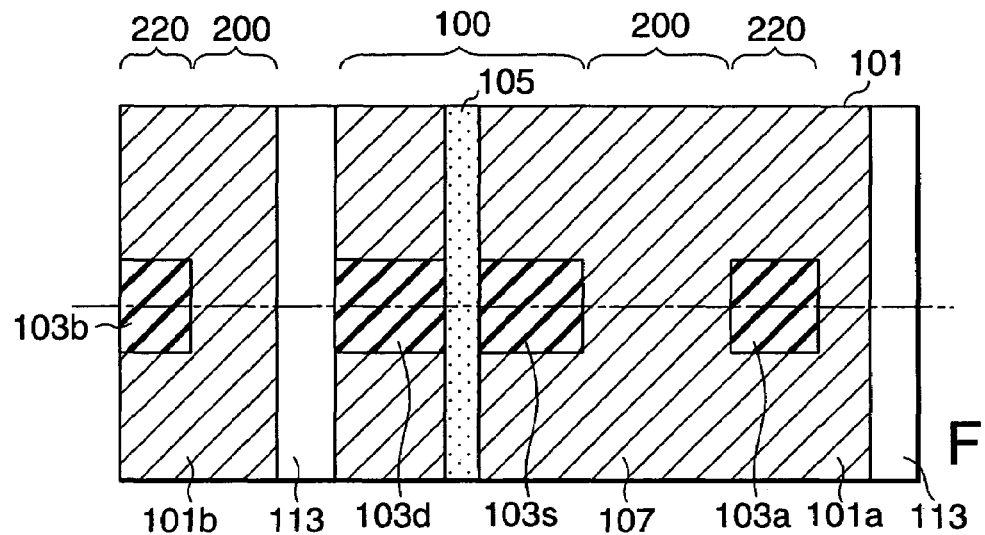
FIGS. 2A to 2C are respectively plane layout drawings showing the semiconductor integrated circuit according to the embodiment 1 of the invention.

According to the layout drawing shown in FIG. 2A, the diffusion layer 103s to be the source region, and the diffusion layer 103d to be the drain region, of the n-type transistor, and the well contact diffusion layer 103a composed of the p-type diffusion layer for biasing the p-well region 101a to the substrate potential, are formed in the p-well region 101a.

Moreover, a well contact diffusion layer 103b composed of an n-type diffusion layer for biasing the n-well region 101b to the substrate potential, is formed in the n-well region 101b.

The gate electrode 105 composed of, for example, polysilicon to be the gate of the transistor is formed so as to traverse the diffusion layer 103s to be the source region and the diffusion layer 103d to be the drain region.

Here, the silicide layer 107 is formed on the entire surface of the semiconductor substrate 101 except for a region 113 from which the silicide layer is removed.

Figure 2B:
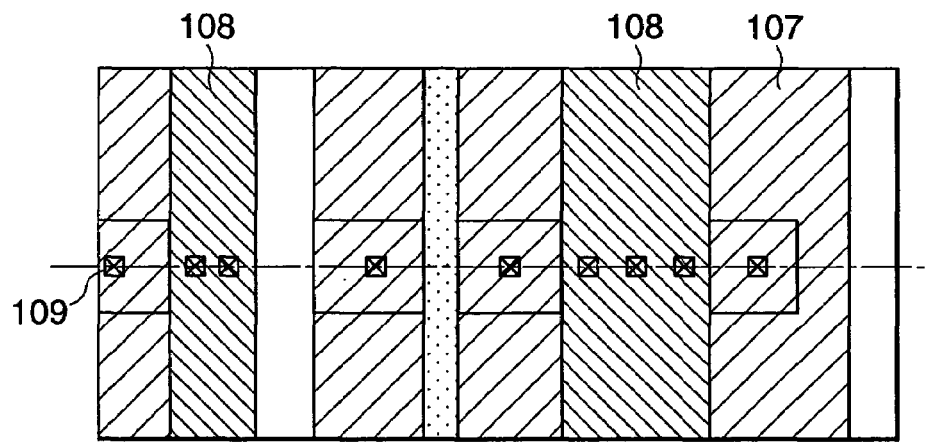

According to the layout drawing shown in FIG. 2B, the power supply wiring layer 108 which is to be the wiring layer of the zeroth layer is formed in the power supply wiring regions 200.

Figure 2C:
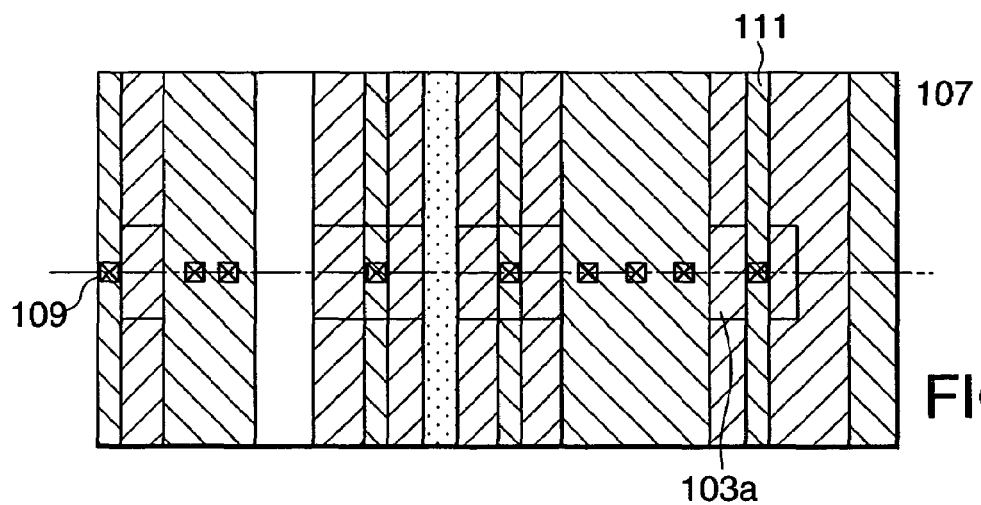

According to the layout drawing shown in FIG. 2C, the power supply wiring layer 108 of the wiring layer of the zeroth layer, the diffusion layer 103s which is to become the source region, the diffusion layer 103d to become the drain region, and the well contact diffusion layers 103a and 103b, are connected respectively by the contacts 109 to the wiring layer 111 of the first layer.

Moreover, in the power supply wiring region 200, the decoupling capacitor is formed by the power supply wiring 108 and the silicide layer 107, where the silcde layer forming the lower electrode of the decoupling capacitor is connected electrically to the semiconductor substrate 101 via the well contact diffusion layer 103a or 103b.

The n-type MOSFET and the decoupling capacitor are formed in the manner as described in the above.

Figure 3:
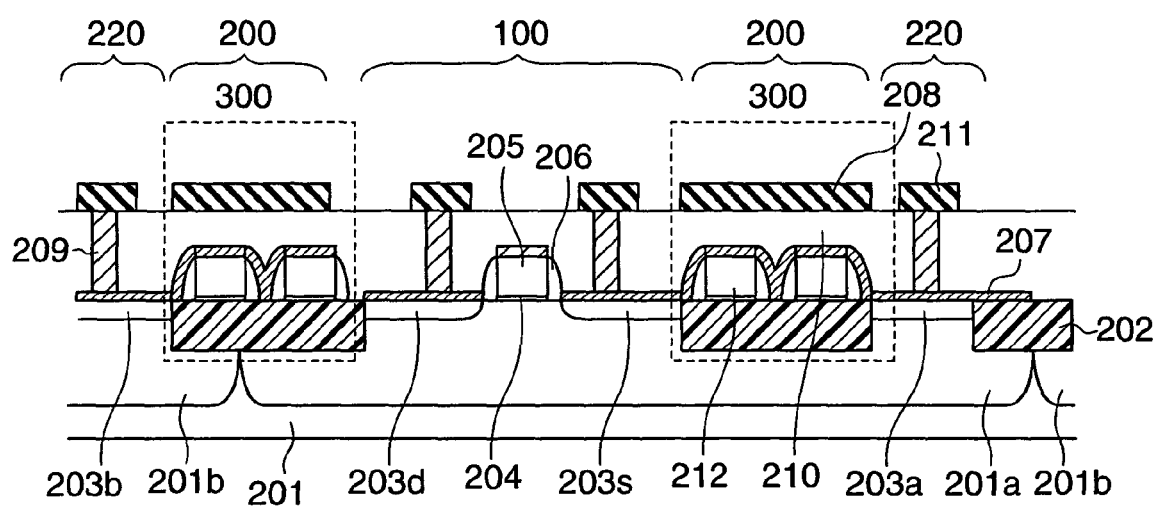
FIG. 3 is a sectional view of the semiconductor integrated circuit according to embodiment 2 of the invention.

In FIG. 3 is shown a sectional view of the semiconductor integrated circuit according to the embodiment 2 of the invention.

A transistor region 100, power supply wiring regions 200 and ground wiring regions 220 are formed on a semiconductor substrate 201 with p- or n-conductivity type.

The power supply wiring region 200 is formed above an element isolation region 202. The element isolation region 202 is composed of an oxide film, and is formed by the LOCOS method, shallow trench method or the like.

In the semiconductor substrate 201, a semiconductor region whose conductivity type is the p-type, namely, a p-well region 201a, and a semiconductor region whose conductivity type is the n-type, namely, an n-well region 201b are formed.

In the figure, the transistor formed in the transistor region 100 is of an n-type MOSFET. In the transistor region 100, there are formed a gate electrode 205 consisting of polycrystlline silicon, a sidewall insulating film 206 consisting of an oxide film or a nitride film or their composite film, a gate insulating film 204 consisting of a thermal oxide film or a high permittivity material, a diffusion layer 203d to be a drain region, and a diffusion layer 203s to be a source region.

The diffusion layers 203d and 203s of the transistor generally possess conductivity type opposite to that of the well region, and it is an n+ region in the figure.

A silicide layer 207 consisting of a silicon compound of metal such as titanium or cobalt is formed on the surface of the gate electrode 205, the diffusion layer 203d to be the drain region and the diffusion layer 203s to be the source region. The diffusion layer 203s to be the source region in the transistor region 100, and the well contact diffusion layer 203a in the ground wiring region 220 are short-circuited electrically by a plate-like silicide layer 207 to be fixed to the ground potential.

The silicide layer 207 is used generally for the purpose of reducing not only the sheet resistance of the diffusion layers, but also for reducing at the same time the sheet resistance of the gate electrode 205 consisting of polycrystalline silicon.

After subjecting the diffusion layers to the silicidation reaction, excess silicide layer remaining on the element isolation oxide film is normally removed, but the silicide layer 207 on the power supply wiring region 200 and the ground wiring region 220 is not removed and only the unwanted silicide layer other than in these regions is removed in this embodiment.

After forming an interlayer film 210 consisting of an oxide film on the silicide layer 207 by CVD or the like, a first wiring layer 211 is formed.

Then, the diffusion layer 203d to be the drain region and the diffusion layer 203s to be the source region, of the transistor are connected to the first wiring layer 211 via contacts 209.

In the power supply wiring region 200, there is formed a decoupling capacitor region 300 for absorbing the power supply noise, which constitutes the feature part of the semiconductor integrated circuit according to the embodiment 2.

The decoupling capacitor utilizes the interlayer capacitance due to the interlayer film 210 in which the power supply wiring layer 208 in the power supply wiring region 200 functions as the uppe electrode of the decoupling capacitor, and the silicide layer 207 which serves as its lower electrode is connected to the semiconductor substrate 201 via the well contact diffusion layer 203a or 203b.

The embodiment 2 differs from the embodiment 1 in that a plurality of protrusions 212 that are formed at the same time with the formation of the gate electrode 205 are provided on the element isolation oxide film 202 of the power supply wiring region 200.

Although the protrusions 212 may be given an arbitrary shape and height, it is possible to form them simultaneously with the process of formation of the gate electrode 205 without affecting the size controllability of the gate electrode 205.

Then, by forming the silicide layer 207 on the entire surface of the protrusions 212 the lower electrode of the decoupling capacitor is formed.

Here in the power supply wiring region 200, the thickness of the interlayer film 210 between the silicide layer 207 on the protrusions 212 that becomes the lower electrode, and the power supply wiring layer 208 that becomes the upper electrode, is smaller than the thickness of the interlayer film in the parts other than the protrusions 212 because of the presence of the protrusions 212. As a result, it is possible to increase the degree of capacitive coupling between the ground wiring layer and the power supply wiring layer without the need for forming a wiring layer corresponding to the power supply wiring layer 108 in the embodiment 1.

The power supply wiring layer 208 and the first wiring layer 211 are formed using a metal such as aluminum, copper, tungsten and gold, or polysilicon as the raw material.

Moreover, the interlayer film 210 is formed using, for example, a nitride film or a plasma oxide film as the raw material.

As described in the above, according to the embodiment, it is possible to eliminate the process of forming a wiring layer corresponding to the power supply wiring layer 108 in the embodiment 1, so that it is possible to increase the capacitive coupling between the ground wiring layer and the power supply wiring layer, similar to the embodiment 1, by a smaller number of processes, and to obtain a semiconductor integrated circuit with effectively reduced influence of the noise on the power supply wirings.

In the second embodiment of the invention, the decoupling capacitor region 300 is formed above the element isolation region 202, but the formation of the region 300 is not limited to this configuration, and maybe formed in a region other than the element isolation region 202. However, by forming the region 300 above the element isolation region 202 as is done in the embodiment 2, it is possible to form a decoupling capacitor with enhanced capacitive coupling without causing an increase in the chip area.

Moreover, in the second embodiment of the invention, the silicide layer 207 connected to the semiconductor substrate 201 is made a ground wiring by fixing the semiconductor substrate 201 to the ground potential, and the upper electrode of the decoupling capacitor is made the power supply wiring by fixing the upper electrode to the power supply potential. However, the configuration is not limited to this mode, and the present invention is applicable to the case in which the silicide layer 207 connected to the semiconductor substrate 201 is made a power supply wiring by fixing the semiconductor substrate 201 to the power supply potential, and the upper electrode of the decoupling capacitor is made a ground wiring by fixing it to the ground potential.

Figure 4A:
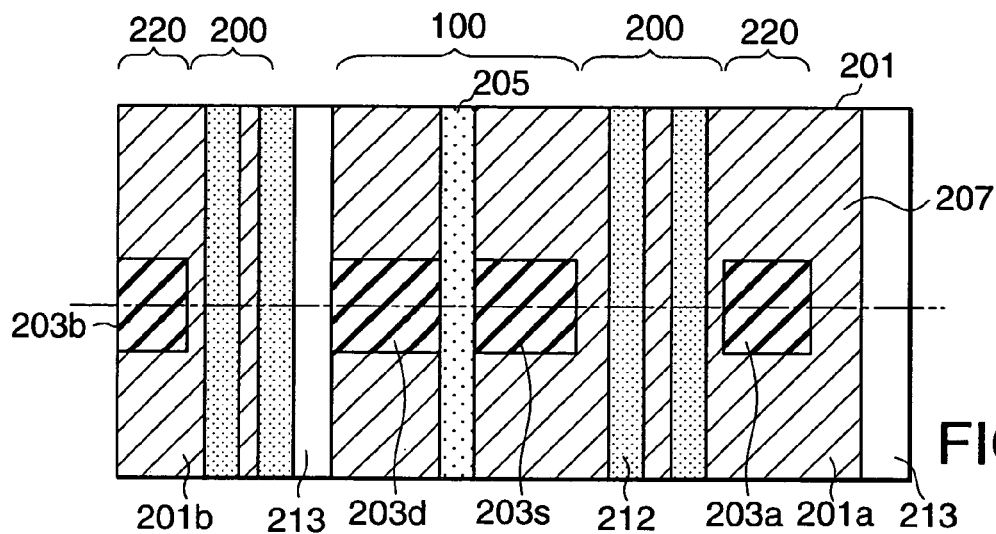
FIGS. 4A to 4C are respectively plane layout drawings showing the semiconductor integrated circuit according to the embodiment 2 of the invention.

FIG. 4 is a layout drawing for describing the second embodiment of the invention. According to a layout drawing shown in FIG. 4A, the diffusion layer 203s which is to be the source region and the diffusion layer 203d which is to be the drain region of the n-type transistor, and the well contact layer 203b consisting of a p-type diffusion layer for biasing the p-well region 201a to the substrate potential, are formed in the p-well region 201a.

Moreover, in the n-well region 201b, there is formed a well contact diffusion layer 203b consisting of an n-type diffusion layer for biasing the n-well region 201b to the substrate potential.

The gate electrode 205 consisting of, for example, polysilicon which becomes the gate of the transistor is formed so as to traverse the diffusion layer 203s that becomes the source region and the diffusion layer 203d that becomes the drain region.

At the same time, a plurality of protrusions 212 are formed in the power supply wiring region 200. Although the protrusions 212 may be formed in an arbitrary pattern, it is possible to form them simultaneously with the same process as the formation of the gate electrode 205 without affecting the size controllability of the gate electrode 205.

Then, the silicide layer 207 is formed on the entire surface of the semiconductor substrate except for the region 213 from which the silicide layer is removed, and the silicide layer 207 formed on the protrusions 212 constitutes the lower electrode of the decoupling capacitor.

Figure 4B:
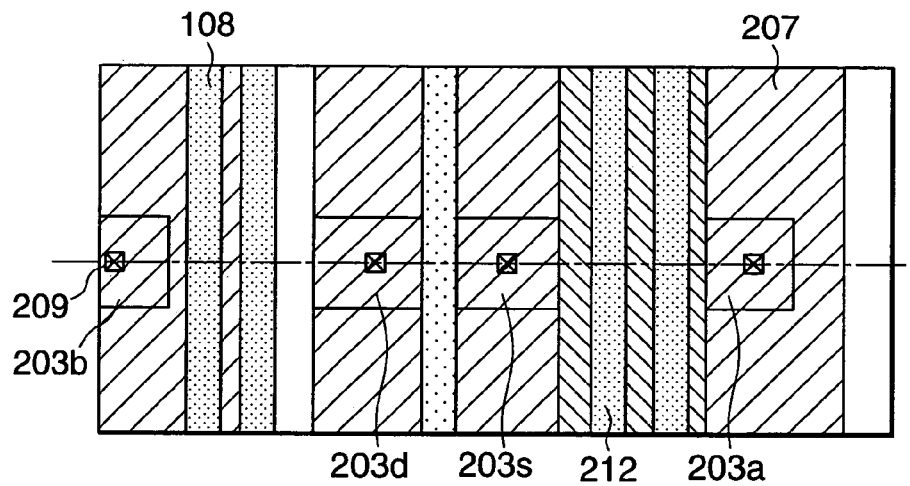

According to the layout drawing shown in FIG. 4B, the contacts 209 are formed in the diffusion layer 203s to be the source region, the diffusion layer 203d to be the drain region and the well contact diffusion layers 203a and 203b.

Figure 4C:
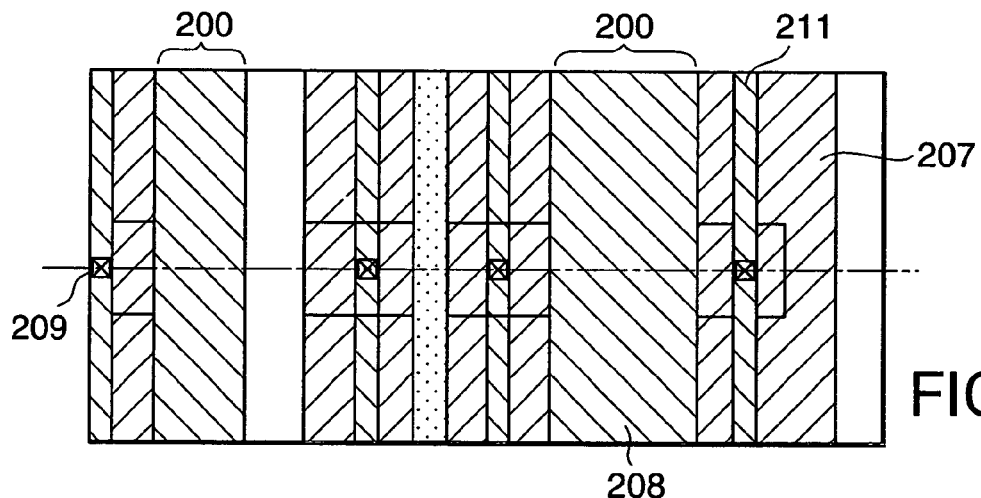

According to the layout drawing shown in FIG. 4C, the power supply wiring layer 208 and the first wiring layer 211 are formed respectively in the power supply wiring region 200 and the region where the contact 209 is formed.

Here, the decoupling capacitor is formed in the power supply wiring region 200 by the power supply wiring layer 208 and the silicide layer 207 formed on the protrusions 212 and the interlayer film 210 between these layers.

In the manner as described in the above, the n-type MOSFET and the decoupling capacitor are formed.

As described in the above, according to the present invention it is possible to obtain a decoupling capacitor which has a large capacity, and yet does not increase the parasitic inductance even when it is applied to a multilayer wiring structure.

As a result, it is possible to obtain a semiconductor integrated circuit which can operate stably and suppress noise that propagates on the power supply wiring or on the ground wiring even in the high frequency region.

Although the invention has been described in reference to specific embodiments, this description is not meant to be construed in a limiting sense. Various modifications of the disclosed embodiments will become apparent to persons skilled in the art upon reference to the description of the invention. It is therefore contemplated that the appended claims cover any modifications or embodiments as fall within the true scope of the invention.

What is claimed is:

1. A semiconductor integrated circuit comprising:
a power supply wiring;
a ground wiring; and
a decoupling capacitor formed between said power supply wiring and said ground wiring, said decoupling capacitor comprising an upper electrode, a lower electrode, and an insulating material in between the electrodes,
wherein at least one of the electrodes of said decoupling capacitor comprises a shield layer formed in a plane shape on a semiconductor substrate, and said shield layer is electrically connected directly to said semiconductor substrate via a diffusion layer, and extends from the diffusion layer to the decoupling capacitor in a plane parallel to the substrate, such that a plane shaped portion of said shield layer contacts said diffusion layer, said shield layer is fixed to a power supply potential or said ground potential, and said decoupling capacitor does not overlap said diffusion layer,
and wherein the lower electrode comprises the shield layer.

2. The semiconductor integrated circuit as claimed in claim 1, wherein, another of the electrodes of said decoupling capacitor, which opposes the electrode comprising said shield layer, includes a wiring layer connected to wirings on an uppermost layer of a multilayer wiring structure via contact electrodes, and a capacitor insulating film for forming said decoupling capacitor is provided between said wiring layer and said shield layer.

3. The semiconductor integrated circuit as claimed in claim 1, wherein said decoupling capacitor is formed on an element isolation oxide film.

4. The semiconductor integrated circuit as claimed in claim 1, wherein said shield layer comprises a silicon compound of a metal.

5. The semiconductor integrated circuit as claimed in claim 1, wherein said diffusion layer is a well contact diffusion layer.

6. The semiconductor integrated circuit as claimed in claim 1, wherein said semiconductor substrate includes a p-well region and an n-well region.

7. The semiconductor integrated circuit as claimed in claim 1, wherein said decoupling capacitor is located opposite side with reference to a near gate electrode formed on said semiconductor substrate.

8. A semiconductor integrated circuit comprising:
a power supply wiring;
a ground wiring; and
a decoupling circuit formed between said power supply wiring and said ground wiring, said decoupling circuit comprising an upper electrode, a lower electrode, and an insulating material in between the electrodes,
wherein at least one electrode of said decoupling circuit comprises a shield layer obtained by covering a plurality of protrusions formed on a semiconductor substrate, and said shield layer is electrically connected directly to the semiconductor substrate via a diffusion layer, and extends from the diffusion layer to the decoupling capacitor in a plane parallel to the substrate, such that a plane shaped portion of said shield layer contacts said diffusion layer, said shield layer is fixed to a power supply potential or said ground potential, and said decoupling circuit does not overlap said diffusion layer, and
wherein the lower electrode comprises the shield layer.

9. The semiconductor integrated circuit as claimed in claim 8, wherein said protrusions are formed simultaneously with a gate electrode by a same formation process used for the gate electrode.

10. The semiconductor integrated circuit as claimed in claim 8, wherein said decoupling circuit is formed on an element isolation oxide film.

11. The semiconductor integrated circuit as claimed in claim 8, wherein said shield layer comprises a silicon compound of a metal.

12. The semiconductor integrated circuit as claimed in claim 8, wherein said diffusion layer is a well contact diffusion layer.

13. The semiconductor integrated circuit as claimed in claim 8, wherein said semiconductor substrate includes a p-well region and an n-well region.

14. A semiconductor integrated circuit comprising:
a power supply wiring;
a ground wiring; and
a decoupling capacitor formed between said power supply wiring and said ground wiring, said decoupling capacitor comprising an upper electrode, a lower electrode, and an insulating material in between the electrodes,
wherein at least one of electrodes of said decoupling capacitor comprises a shield layer formed in a plane shape on a semiconductor substrate, and said shield layer is electrically connected directly to said semiconductor substrate via a diffusion layer, and extends from the diffusion layer to the decoupling capacitor in a plane parallel to the substrate, such that a plane shaped portion of said shield layer contacts said diffusion layer and is a lowermost conductive layer on said semiconductor substrate, said shield layer is fixed to a power supply potential or said ground potential, and said decoupling capacitor does not overlap said diffusion layer and is located adjacent to said diffusion layer, and
wherein the lower electrode comprises the shield layer.

15. The semiconductor integrated circuit as claimed in claim 14, wherein, another of said the electrodes of said decoupling capacitor, which opposes said electrode comprising said shield layer, includes a wiring layer connected to wirings on an uppermost layer of a multilayer wiring structure via contact electrodes, and a capacitor insulating film for forming said decoupling capacitor is provided between said wiring layer and said shield layer.

16. The semiconductor integrated circuit as claimed in claim 14, wherein said decoupling capacitor is formed on an element isolation oxide film.

17. The semiconductor integrated circuit as claimed in claim 14, wherein said shield layer comprises a silicon compound of a metal.

18. The semiconductor integrated circuit as claimed in claim 14, wherein said diffusion layer is a well contact diffusion layer.

19. The semiconductor integrated circuit as claimed in claim 14, wherein said semiconductor substrate includes a p-well region and an n-well region.

* * * * *